United States Patent [19]
Lumbard

[11] Patent Number: 5,923,536
[45] Date of Patent: *Jul. 13, 1999

[54] END-WALL FRAME FOR LED ALPHANUMERIC DISPLAY

[75] Inventor: Marvin Lumbard, Los Gatos, Calif.

[73] Assignee: Siemens Microelectronics, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/907,750

[22] Filed: Aug. 8, 1997

Related U.S. Application Data

[63] Continuation of application No. 08/579,536, Dec. 27, 1995, abandoned.

[51] Int. Cl.⁶ ........................................... H05K 1/00
[52] U.S. Cl. .............................. 361/752; 361/759; 439/68
[58] Field of Search ..................................... 361/724–728, 361/748, 752, 756, 772, 775, 759; 439/68, 526, 862; 264/272.11; 206/706, 710

[56] References Cited

U.S. PATENT DOCUMENTS 4,556,276  12/1985  Curtis, III ................................ 439/862

*Primary Examiner*—Leo P. Picard
*Assistant Examiner*—Jayprakash N. Gandhi

[57] ABSTRACT

An end-wall frame for an LED alphanumeric display circuit board provides full-length accurate standoffs for the display to prevent cracking and crazing of the epoxy coating of the encapsulated device, eliminates the need to apply black paint to the non-display portions of the lens, and provides a device for accurately aligning the printed circuit board in the lensed area.

13 Claims, 4 Drawing Sheets

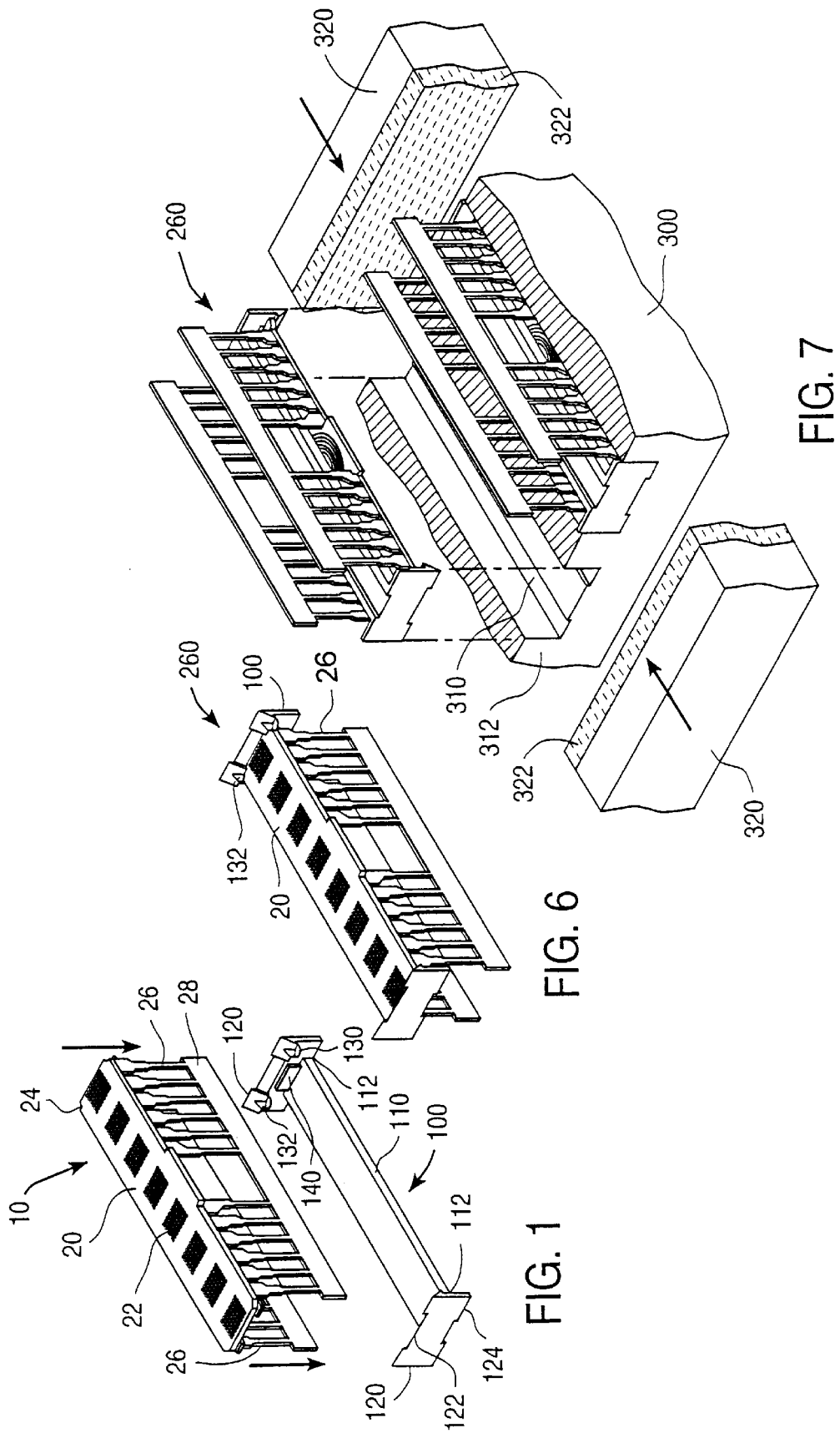

END-WALL FRAME FOR LED ALPHANUMERIC DISPLAY

CROSS-REFERENCE TO RELATED APPLICATION

This is a continuation of Ser. No. 08/579,536 filed Dec. 27, 1995, now abandoned.

FIELD OF THE INVENTION

This invention generally relates to LED alphanumeric displays. Specifically, the invention is directed to a scheme for packaging an LED alphanumeric display.

BACKGROUND OF THE INVENTION

An LED alphanumeric display can be built upon a printed circuit board that will serve as a substrate for the display and its associated circuitry. For purposes of interconnection, leads for power and intelligence can be brought out from one side of the board for insertion in a socket, another board, or some other receptacle.

To protect the display and its associated circuitry and hardware, the board can be encapsulated with epoxy. However, to hold and position the display during the encapsulation process, it would be helpful to provide a means for physically supporting the display circuit board.

SUMMARY OF THE INVENTION

This and other objects are achieved by the present invention which provides a snap-on, end-wall frame for the printed circuit board. The end-wall frame is a "U"-shaped cradle, having a connecting span member that fits under the printed circuit board between the leads, and end-wall members, connected at right angles to either end of the connecting span member, that grasp opposing ends of the board.

The end-wall frame satisfies three goals. First, the end-wall frame provides full-length accurate standoffs for the display to prevent cracking and crazing of the epoxy coating of the encapsulated device. Second, it eliminates the need to apply black paint to the non-display portions of the lens, which is required to insure the integrity of the display and provide contrast. Only the end walls of the display need be painted; optionally, one may paint the sides and the rails to improve the aesthetic appearance of the display. Third, the end-wall frame provides a means for accurately aligning the printed circuit board in the lensed area, so that the individual display elements are properly registered with respect to the lenses.

BRIEF DESCRIPTION OF THE DRAWINGS

For a better understanding of the invention, reference is made to the following description of an exemplary embodiment thereof, and to the accompanying drawings, wherein:

FIG. 1 is a perspective view of an end-wall frame of the present invention with an LED alphanumeric display board adjacent the frame;

FIG. 6 is a perspective view of the end-wall frame attached to a printed circuit board;

FIG. 7 is a perspective view of the end-wall frame attached to a printed circuit board, in an inverted orientation, being inserted into a channel mold employing silicone rubber faced clamp blocks to block the ends of the channel;

DETAILED DESCRIPTION

Figure 3:
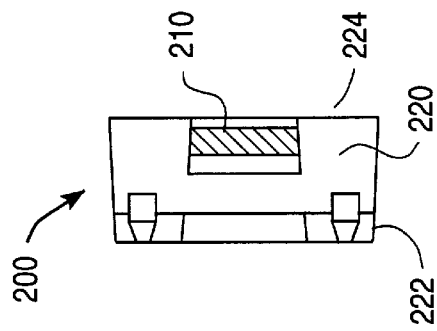
FIGS. 2–5 are drawings of an alternative end-wall frame.

FIG. 1 shows an LED alphanumeric display assembly 10 suspended above an end-wall frame 100. In this illustration, the display assembly 10 has a printed circuit board 20 generally rectangular in shape, but it could have a different shape to suit the particular application.

The printed circuit board 20 has several active display elements 22 distributed along the length of the board 20. Alignment notches 24 are provided at each corner of the printed circuit board 20. Finally, the printed circuit board 20 has two lead frames 26, each having a temporary tiebar 28 that will be removed during later processing.

In FIG. 1, the end-wall frame 100 is shown positioned below the display assembly 10. The end-wall frame 100 has a connecting span member 110 and two end-wall members 120, each end-wall member 120 having a free end 122 and a fixed end 124. The end-wall members 120 are connected at their respective fixed ends 124 at right angles to either end 112 of the connecting span member 110. In this embodiment, the board 20 sits between the two end-wall members 120 just above the connecting span member 110. The end-wall frame 100 can be fabricated from black plastic such as Lexan®, manufactured by General Electric, or other material. The frame 100 can be made through an injection molding process using Lexan® or another material and a multiple-position mold (not shown).

In the embodiment shown in FIG. 1, the end-wall members 120 each have two catches 130 that taper outwardly towards the opposite end-wall member 120. An alignment feature 132, a conical protrusion, is situated on each catch 130. Rests 140 are situated at the junction of the connecting span member 110 and each end-wall member 120. In this embodiment, the rests 140 extend from the span member 110 up to some point below the catches 130. When the circuit board 20 is inserted into the frame 100, the board 20 will lodge between the catches 130 and the rest 140. The two downward-facing arrows indicate the direction of travel of the circuit board 20 with respect to the end-wall frame 100.

Figure 2:
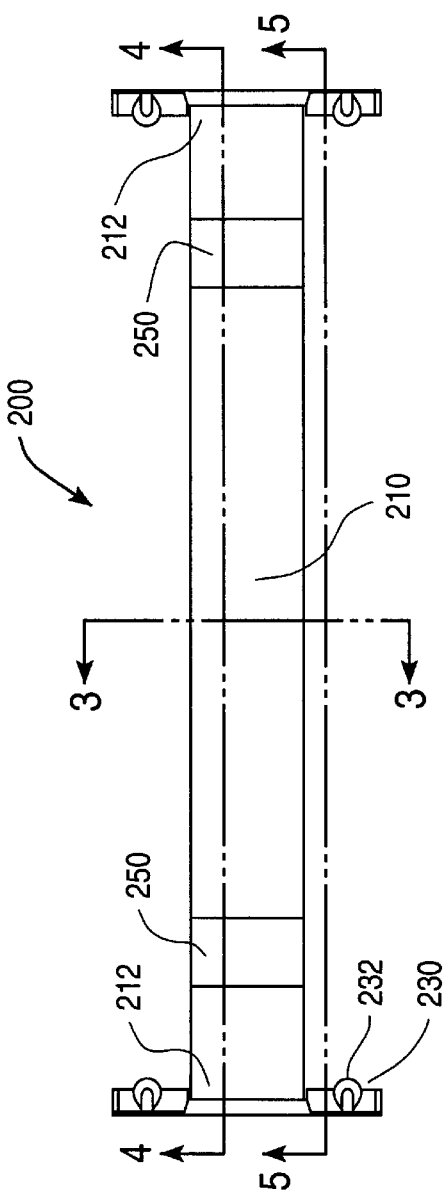
Figure 4:
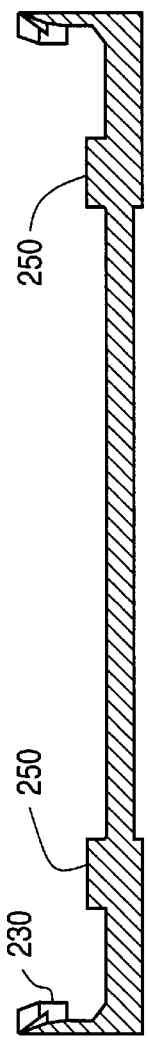
Figure 5:
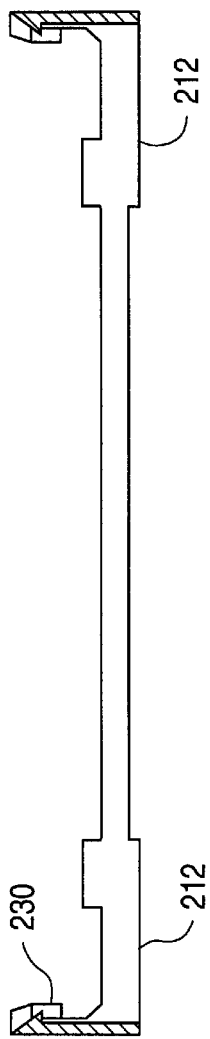

A variation of the end-wall frame just described is shown in FIGS. 2 through 5. FIG. 2 is a top view of the frame 200 and FIGS. 3, 4, and 5 are sectional views, as indicated. This alternative end-wall frame also has a connecting span member 210 joining two end-wall members 220, each end-wall member 220 having a free end 222 and a fixed end 224. The end-wall members 220 are connected at their respective fixed ends 224 at right angles to either end of 212 the connecting span member 210.

As do the end-wall members 120 of FIG. 1, the end-wall members 220 of FIG. 2 each have two catches 230 that taper outwardly towards the opposite end-wall member 220, and alignment features 232 on each catch 230. Instead of a rest at the junction of the connecting span members 210 and end-wall members 220, this embodiment of the alternative end-wall frame 200 has two rests 250 located on the span member 210 away from the end-wall members 220.

In practice, the printed circuit board 20 is inserted in the end-wall frame 100 (or 200) by pushing the board 20 past the catches 130 (or 230) until the board 20 sits on the rests 140 (or 250), secured in place by the catches 130 (or 230), as illustrated in FIG. 6. The four alignment notches 24 provided at each corner of the printed circuit board 20 align with the four corresponding alignment features 132 (or 232) on the end-wall frame 100 (or 200).

Figure 8:
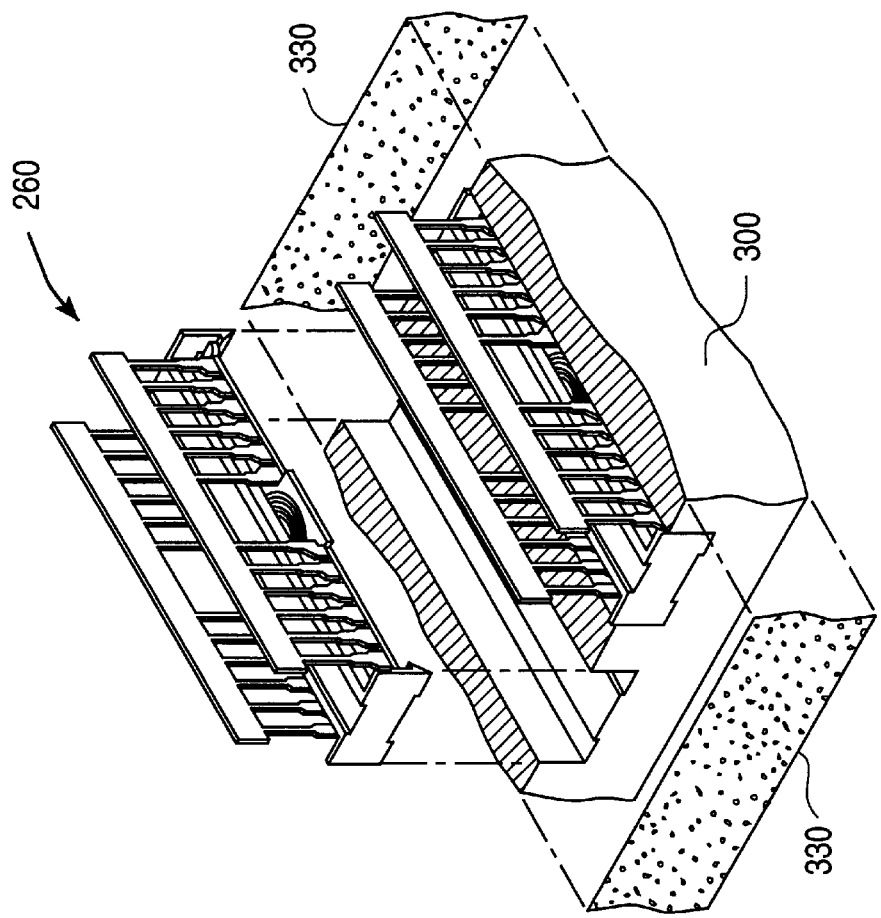
FIG. 8 is a perspective view of the end-wall frame attached to a printed circuit board, in an inverted orientation, being inserted into a channel mold employing adhesive lensing tape to block the ends of the channel.

The combined display and frame assembly 260 of the board 20 and end-wall frame 100 is inserted (in an inverted orientation) into a channel mold 300, as shown in FIG. 7. The assembly fits into the mold channel 310 and then clamp blocks 320 are placed against each end 312 of the channel 310 (as indicated by the two inwardly-facing arrows), simultaneously compressing both end-wall members 120 and the channel mold 300, and providing an epoxy-tight seal on the end-wall frame 100 and the channel mold 300. The clamp blocks 320 shown in FIG. 7 have silicone rubber facing 322. Alternatively, one can use silicone adhesive tape 330 as shown in FIG. 8.

Figure 9:
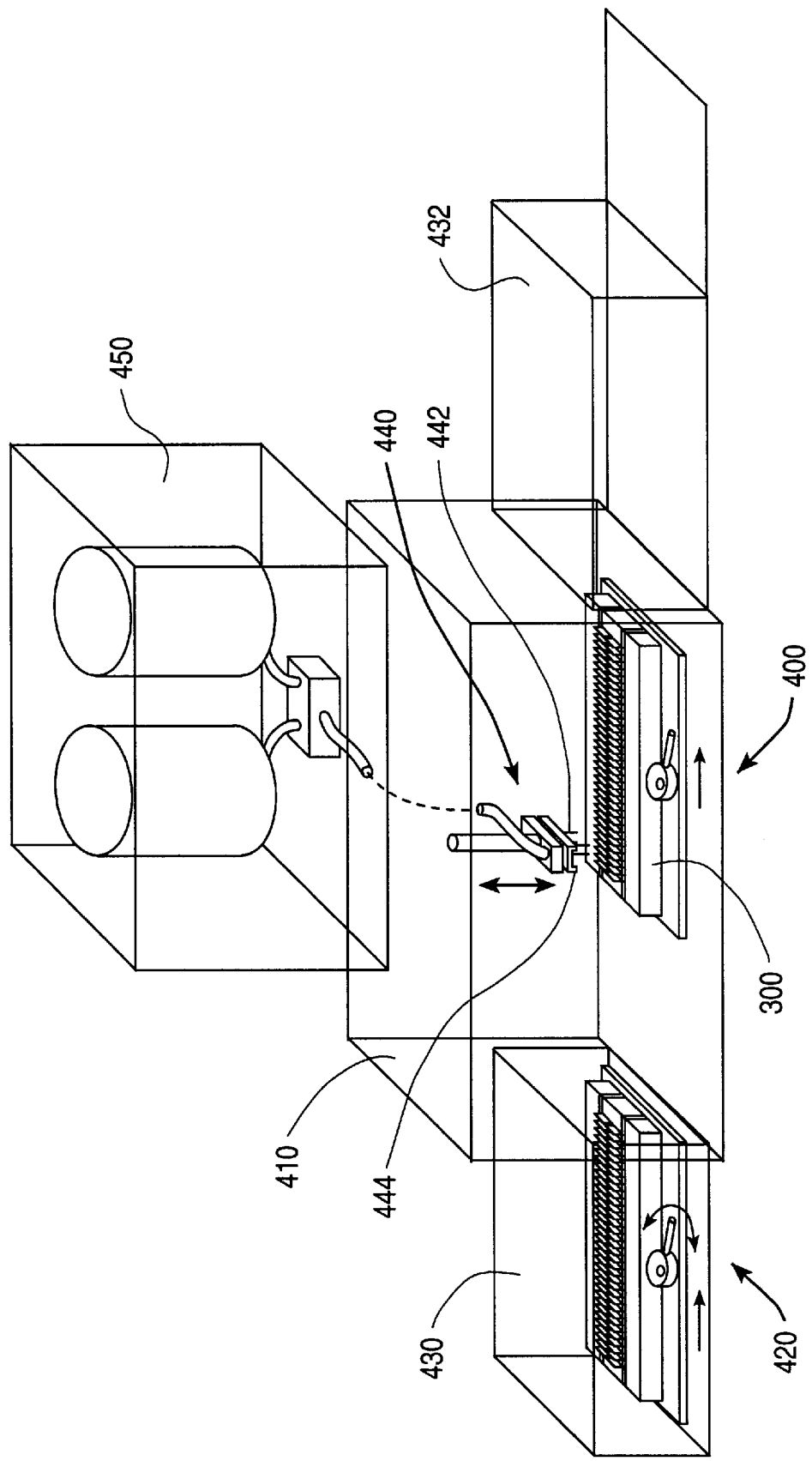
FIG. 9 is a drawing of an automatic vacuum encapsulation system.

Epoxy is then applied to encapsulate the combined display and frame assembly 260. The channel mold 300 containing the assembly 260 is shuttled into the encapsulation chamber 410 of an automatic vacuum encapsulation system 400 such as the one illustrated in FIG. 9. One may use a programmable automatic shuttle system 420 to move the molds 300 through the encapsulation system 400. As shown here, the encapsulation system 400 could have input and output airlocks 430 and 432. In practice, the encapsulation chamber 410 would be kept under constant vacuum.

Epoxy can be applied to the channel mold 300 by a needle/manifold assembly 440, which can have four needles 442 and z-axis maneuverability and programmability. A positive displacement meter/mix epoxy dispensing system 450 can be employed to provide epoxy to the needle/manifold assembly 440.

Using the shuttle system 420, the channel mold 300 passes through the input airlock 430 and into the encapsulation chamber 410. The channel mold 300 is then positioned such that the first display device is aligned under the needle/manifold assembly 440. A needle guide block 444 attached to the needle/manifold assembly 440 is lowered, restraining the lead frames 26 and guiding the needles 442 past the leadframes 26. Epoxy is then volumetrically dispensed through all four needles 442 simultaneously. After the particular device is filled with epoxy, the needle/manifold assembly 440 is raised and the channel mold 300 is repositioned to bring the another display and frame assembly 260 under the needle/manifold assembly 440. After all of the display and frame assemblies 260 in the channel mold 300 have been filled, the mold 300 is shuttled into the output airlock 432 and a new mold 300 is shuttled into the encapsulation chamber 410. The exiting mold 300 is then shuttled to or placed in an oven (not shown), such as elevator-type oven, for gelling.

Figure 10:
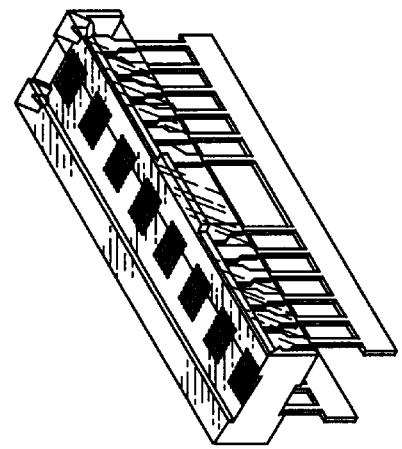
FIG. 10 is a perspective view of a finished display having an end-wall frame attached to a printed circuit board.

For encapsulation, one may use OS-1900 epoxy having a gel time of ten minutes at 120° C. An encapsulated device is shown in FIG. 10.

The embodiments described herein are merely illustrative of the principles of the present invention. Various modifications may be made thereto by persons ordinarily skilled in the art, without departing from the scope or spirit of the invention.

What is claimed is:

1. A circuit-board assembly, comprising:

a generally rectangular printed circuit board;

an end-wall frame having two generally parallel, spaced-apart end-wall members, each end-wall member having a free end and a fixed end, and an interconnecting span member connected to the fixed-ends of each end-wall member, where the printed circuit board is held in position by the end-wall members; and an encapsulation that encapsulates said circuit board assembly in said held position.

2. The assembly as set forth in claim 1, wherein each end-wall member has at least one catch that tapers outwardly towards the opposite end-wall member.

3. The assembly as set forth in claim 1, wherein each end-wall member has at least one catch that tapers outwardly towards the opposite end-wall member, and each catch has an alignment feature.

4. The assembly as set forth in claim 3, wherein the alignment feature is a conical protrusion.

5. The assembly as set forth in claim 1, wherein each end-wall member has at least two catches that taper outwardly towards the opposite end-wall member, and each catch has an alignment feature.

6. The assembly as set forth in claim 5, wherein the alignment feature is a conical protrusion.

7. The assembly as set forth in claim 1, further comprising a rest member positioned at each of the connections between the fixed-ends of the end-wall members and the interconnecting span member.

8. The assembly as set forth in claim 1, further comprising at least one rest member positioned on the interconnecting span member.

9. The apparatus as set forth in claim 1, wherein said encapsulation has a generally rectangular cross-section, the size and form of said cross-section is given by the size and form of said end-wall members.

10. A display apparatus, comprising:

a display assembly including a generally rectangular printed circuit board;

an end-wall frame having two generally parallel, spaced-apart end-wall members, each end-wall member having a free end and a fixed end, and an interconnecting span member connected to the fixed-ends of each end-wall member, where the display assembly is held in position by the end-wall members; and an encapsulation, encapsulating said display assembly in said held position.

11. A display apparatus as in claim 10, wherein the end-wall members reduce reflection.

12. A display apparatus as in claim 11 wherein the position of the display assembly, the index of refraction of the encapsulation, and the reduced-reflection end-wall reduce internal reflection of the display.

13. A display apparatus as in claim 10, wherein the held position places the display assembly in registration with a lens.

* * * * *